United States Patent
Cheng et al.

(10) Patent No.: US 9,853,076 B2
(45) Date of Patent: Dec. 26, 2017

(54) STACKED GRID FOR MORE UNIFORM OPTICAL INPUT

(71) Applicant: Taiwan Semiconductor Manufacturing Co., Ltd., Hsin-Chu (TW)

(72) Inventors: Yun-Wei Cheng, Taipei (TW); Horng-Huei Tseng, Hsin-Chu (TW); Chao-Hsiung Wang, Hsin-Chu (TW); Chun-Hao Chou, Tainan (TW); Tsung-Han Tsai, Zhunan Township (TW); Kuo-Cheng Lee, Tainan (TW); Yung-Lung Hsu, Tainan (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 14/688,106

(22) Filed: Apr. 16, 2015

(65) Prior Publication Data
US 2016/0307941 A1 Oct. 20, 2016

(51) Int. Cl.
*H01L 31/0232* (2014.01)
*H04N 5/335* (2011.01)
*H01L 27/146* (2006.01)
*H01L 31/062* (2012.01)
*H04N 3/14* (2006.01)
*H01L 31/18* (2006.01)

(52) U.S. Cl.
CPC ...... *H01L 27/1463* (2013.01); *H01L 27/1464* (2013.01); *H01L 27/14623* (2013.01); *H01L 27/14685* (2013.01); *H01L 27/14621* (2013.01); *H01L 27/14627* (2013.01)

(58) Field of Classification Search
CPC .......... H01L 27/1463; H01L 27/14623; H01L 27/14621; H01L 27/14627; H01L 27/1464; H01L 27/14685
USPC .................................................. 257/427–437
See application file for complete search history.

(56) References Cited

U.S. PATENT DOCUMENTS 7,138,618 B2* 11/2006 Mishina ............ H01L 27/14603
250/208.1
8,530,266 B1 9/2013 Chen et al.
(Continued)

FOREIGN PATENT DOCUMENTS

WO 2012128076 A1 9/2012

OTHER PUBLICATIONS

U.S. Appl. No. 14/688,084, filed Apr. 16, 2015.
(Continued)

*Primary Examiner* — Marcos D Pizarro
*Assistant Examiner* — Nelson Garces
(74) *Attorney, Agent, or Firm* — Eschweiler & Potashnik, LLC

(57) ABSTRACT

A back side illumination (BSI) image sensor with stacked grid shifting is provided. A pixel sensor is arranged within a semiconductor substrate. A metallic grid segment is arranged over the pixel sensor and has a metallic grid opening therein. A center of the metallic grid opening is laterally shifted from a center of the pixel sensor. A dielectric grid segment is arranged over the metallic grid and has a dielectric grid opening therein. A center of the dielectric grid opening is laterally shifted from the center of the pixel sensor. A method for manufacturing the BSI image sensor is also provided.

20 Claims, 9 Drawing Sheets

(56) References Cited

U.S. PATENT DOCUMENTS

| | | | |
|---|---|---|---|
| 8,766,386 B2 | 7/2014 | Tsuji | |
| 8,803,067 B2 | 8/2014 | Mizuta et al. | |
| 9,570,493 B2 | 2/2017 | Cheng | |
| 2001/0026322 A1* | 10/2001 | Takahashi | H04N 5/2254 348/340 |
| 2008/0116537 A1 | 5/2008 | Adkisson et al. | |
| 2010/0181634 A1 | 7/2010 | Wang et al. | |
| 2011/0108938 A1* | 5/2011 | Nozaki | H01L 27/14621 257/432 |
| 2012/0267743 A1 | 10/2012 | Nakamura et al. | |
| 2012/0268631 A1* | 10/2012 | Takase | G02B 3/0068 348/273 |
| 2013/0134536 A1* | 5/2013 | Mori | H01L 27/1462 257/432 |
| 2014/0061842 A1 | 3/2014 | Ting et al. | |
| 2014/0339606 A1* | 11/2014 | Lin | H01L 27/14685 257/228 |
| 2014/0339615 A1* | 11/2014 | Wang | H01L 27/14621 257/294 |
| 2015/0048467 A1 | 2/2015 | Weng et al. | |
| 2015/0087104 A1 | 3/2015 | Tseng et al. | |
| 2015/0171125 A1 | 6/2015 | Jangjian et al. | |
| 2015/0270298 A1 | 9/2015 | Lin et al. | |
| 2016/0033688 A1 | 2/2016 | Wu et al. | |

OTHER PUBLICATIONS

U.S. Appl. No. 14/688,094, filed Apr. 16, 2015.
EMD Performance Materials. Anti Reflective Coatings. Feb. 5, 2015. Retrieved from http://www.emd-performance-materials.com/en/electronic_materials/glossary/anti_reflective_coatings_glossary/anti_reflective_coatings_glossary.html.
U.S. Appl. No. 14/713,172, filed May 15, 2015.
Final Office Action dated Jun. 29, 2016 for U.S. Appl. No. 14/688,084.
Non Final Office Action dated Apr. 12, 2016 U.S. Appl. No. 14/713,172.
Non Final Office Action dated Mar. 22, 2016 U.S. Appl. No. 14/688,084.
Non Final Office Action dated Aug. 18, 2016 U.S. Appl. No. 14/688,094.
Final Office Action dated Oct. 28, 2016 U.S. Appl. No. 14/713,172.
Notice of Allowance dated Sep. 28, 2016 U.S. Appl. No. 14/688,084.
Final Office Action dated Dec. 30, 2016 U.S. Appl. No. 14/688,094.
Non-Final Office Action Dated Sep. 11, 2017 U.S. Appl. No. 14/713,172.

* cited by examiner

STACKED GRID FOR MORE UNIFORM OPTICAL INPUT

BACKGROUND

Many modern day electronic devices comprise optical imaging devices (e.g., digital cameras) that use image sensors. Image sensors convert optical images to digital data that may represent the images. An image sensor may include an array of pixel sensors and supporting logic. The pixel sensors measure incident radiation (e.g., light), and the supporting logic facilitates readout of the measurements. One type of image sensor commonly used in optical imaging devices is a back-side illumination (BSI) image sensor. BSI image sensor fabrication can be integrated into conventional semiconductor processes for low cost, small size, and high through-put. Further, BSI image sensors have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
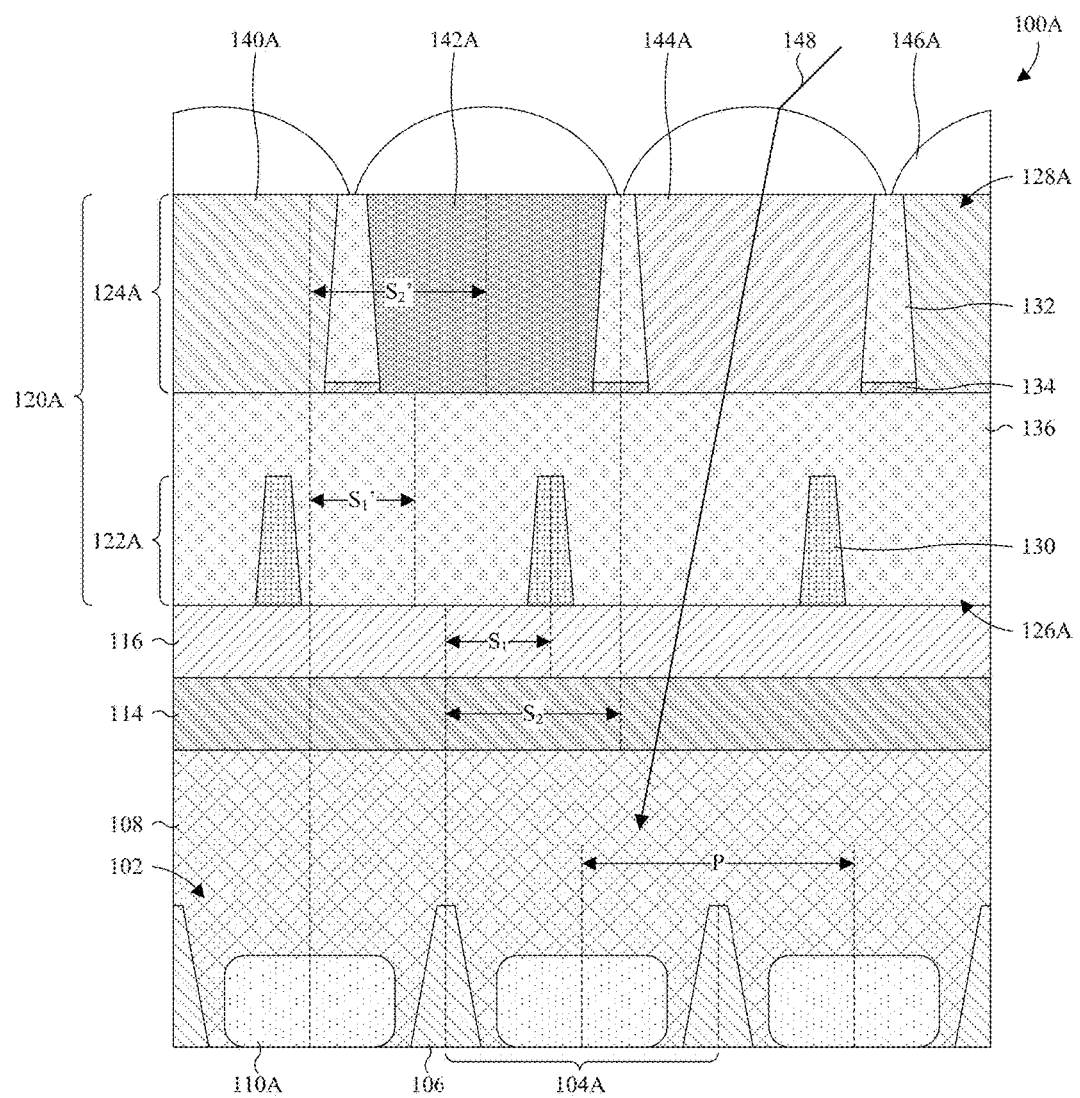
FIG. 1A illustrates a cross-sectional view of some embodiments of a back-side illumination (BSI) image sensor with stacked grid shifting.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Back side illumination (BSI) image sensors typically include an array of pixels sensors arranged within a semiconductor substrate of an integrated circuit. The pixel sensors are arranged between a back side of the integrated circuit and a back-end-of-line (BEOL) metallization stack of the integrated circuit. A metallic grid is arranged on the back side of the integrated circuit over the corresponding pixel sensors. The metallic grid is made up of cell-like metallic grid-segments that laterally surround respective metallic grid openings corresponding to the pixel sensors, and is masked by a capping layer filling the metallic grid openings. Micro lenses and color filters corresponding to the pixel sensors are stacked over the capping layer. The color filters are configured to selectively transmit assigned colors or wavelengths of radiation (e.g., light) to the corresponding pixel sensors, and the micro-lenses are configured to focus incident radiation onto the color filters.

A challenge with the foregoing BSI image sensors is that the metallic grid openings are typically all oriented relative to the corresponding pixel sensors in the same manner. For example, the metallic grid openings may all be centered over the corresponding pixel sensors. Such a configuration is made on the assumption that incident radiation from a point light source impinges on the BSI image sensors in parallel and with a common angle of incidence. However, in practice, incident radiation from a point light source impinges on the BSI image sensors with different angles of incidence for different pixel sensors. Since the metallic grid may obstruct radiation with angles of incidence other than the common angle of incidence, the configuration may lead to non-uniform optical input to the pixel sensors and performance degradation of the BSI image sensors. A solution to the challenge is to shift the metallic grid openings based on the location of the corresponding pixel sensor within the pixel sensor array. However, for larger BSI image sensors, there may be a limit as to the shift amounts, such as that optical input and performance degradation may be remain in certain regions of the BSI image sensors, such as along edges of the BSI image sensors.

In view of the foregoing, the present disclosure is directed to a BSI image sensor that has stacked grid shifting to improve the uniformity of optical input, as well as a method for manufacturing the BSI image sensor. In some embodiments, the BSI image sensor includes a pixel sensor arranged within a semiconductor substrate. An isolation grid, such as a shallow trench isolation (STI) grid or deep trench isolation (DTI) grid, laterally surrounds the pixel sensor and extends into the semiconductor substrate. A metallic grid segment is arranged over the pixel sensor and has a metallic grid opening therein, and a dielectric grid segment is arranged over the metallic grid segment and has a dielectric grid opening therein. Further, the metallic and dielectric grid openings are laterally shifted from the pixel sensor by shift amounts dependent upon a location of the pixel sensor in a pixel sensor array.

By laterally shifting the metallic and dielectric grid openings by amounts dependent upon a location of the pixel sensor in a pixel sensor array, the uniformity of optical input to the pixel sensor can advantageously be increased. For example, the metallic and dielectric grid openings can be shifted in proportion to a distance of the pixel sensor from a center of the pixel sensor array. The improved uniformity in optical input, in turn, leads to improved optical performance (e.g., SNR-10). Further, by laterally shifting both the metallic grid opening and the dielectric grid opening, design flexibility is improved for larger BSI image sensors.

With reference to FIG. 1, a cross-sectional view 100A of some embodiments of a BSI image sensor with stacked grid shifting is provided. The BSI image sensor includes an array 102 of pixel sensors 104A and an isolation grid 106 arranged within a semiconductor substrate 108. The pixel sensors 104A are arranged in rows and/or columns within the semiconductor substrate 108, and configured to convert incident radiation into electrical signals. The pixel sensors 104A include corresponding photodetectors 110A and, in some embodiments, corresponding amplifiers (not shown). The photodetectors 110A may be, for example, photodiodes, and the amplifiers may be, for example, transistors. The isolation grid 106 extends into a lower surface of the semiconductor substrate 108, and laterally surrounds the pixel sensors 104A. The isolation grid 106 is configured to isolate the pixel sensors 104A from one another, and made up of abutting isolation grid segments, such as rectangles or squares. The grid segments correspond to the pixel sensors 104A and laterally surround the corresponding pixel sensors 104A. The isolation grid 106 may be, for example, an STI region and/or an implant isolation region.

An antireflective coating (ARC) 114 and/or a buffer layer 116 are arranged over the semiconductor substrate 108 along an upper surface of the semiconductor substrate 108. In embodiments where both the ARC 114 and the buffer layer 116 are present, the buffer layer 116 is typically arranged over the ARC 114. The ARC 114 may be, for example, an organic polymer or a metallic oxide. The buffer layer 116 may be, for example, an oxide, such as silicon dioxide. The ARC 114 and/or the buffer layer 116 vertically space the semiconductor substrate 108 from a stacked grid 120A that overlies the substrate 108.

The stacked grid 120A includes a metallic grid 122A, which is made up of a plurality of abutting metallic grid segments that are often square or rectangular in shape, and a dielectric grid 124A, which is made up of a plurality of abutting dielectric grid segments overlying the metallic grid 122A. The metallic grid 122A and the dielectric grid 124A respectively define sidewalls for metallic grid openings 126A and dielectric grid openings 128A corresponding to the pixel sensors 104A, and are configured to confine and guide radiation entering the openings 126A, 128A towards the corresponding pixel sensors 104A. For example, the dielectric grid 124A is configured to confine and guide radiation entering the dielectric grid openings 128A towards the pixel sensors 104A by total internal reflection. The metallic and dielectric grid segments correspond to the pixel sensors 104A and laterally surround the corresponding metallic and dielectric grid openings 126A, 128A.

The metallic and dielectric grid openings 126A, 128A are laterally offset or shifted from the corresponding pixel sensors 104A by respective metallic grid shift amounts $S_1$, $S_1'$ and dielectric grid shift amounts $S_2$, $S_2'$. In some embodiments, the shift amounts $S_1$, $S_2$ are relative to the isolation grid 106, the metallic grid 122A, and the dielectric grid 124A. In alternative embodiments, the shift amounts $S_1'$, $S_2'$ are relative to centers of the pixel sensors 104A, the metallic grid openings 126A, and the dielectric grid openings 128A. The shift amounts $S_1$, $S_1'$, $S_2$, $S_2'$ vary depending upon pixel sensor position within the pixel sensor array 102. For example, the shift amounts $S_1$, $S_1'$, $S_2$, $S_2'$ may be proportional to pixel sensor distance from a center of the pixel sensor array 102, such that the shift amounts $S_1$, $S_1'$, $S_2$, $S_2'$ may be greatest at a periphery of the pixel sensor array 102. Further, the dielectric grid shift amounts $S_2$, $S_2'$ typically exceed the metallic grid shift amounts $S_1$, $S_1'$. In some embodiments, ratios of the metallic grid shift amounts $S_1$, $S_1'$ to a pitch P of the pixel sensors 104A (e.g., ratios of $S_1/P$) are between about 0 and about 3, and/or ratios of the dielectric grid shift amounts $S_2$, $S_2'$ to the pitch P (e.g., ratios of $S_2/P$) are between about 0 and about 3. The pitch P is the distance between centers of neighboring pixel sensors.

The metallic and dielectric grids 122A, 124A are respectively arranged within metallic and dielectric grid layers 130, 132 stacked over the ARC 114 and/or the buffer layer 116. The metallic grid 122A is arranged within a metallic grid layer 130 overlying the ARC 114 and/or the buffer layer 116. The metallic grid layer 130 may be, for example, tungsten, copper, or aluminum copper. The dielectric grid 124A is arranged within a dielectric grid layer 132 stacked over the metallic grid layer 130. In some embodiments, the dielectric grid 124A is further arranged within an etch stop layer 134 and/or some other layer (e.g., one or more additional dielectric grid layers) underlying the dielectric grid layer 132. The dielectric grid layer 132 may be, for example, an oxide, such as silicon oxide. The etch stop layer 134 may be, for example, a nitride, such as silicon nitride.

A capping layer 136 is arranged over the metallic grid layer 130 between the metallic grid layer 130 and the dielectric grid layer 132. The capping layer 136 spaces the dielectric grid 124A from the metallic grid 122A and fills the metallic grid openings 126A. Further, the capping layer 136 defines lower surfaces of the dielectric grid openings 128A and, in some embodiments, partially defines sidewalls of the dielectric grid openings 128A. The capping layer 136 is a dielectric, such as silicon dioxide. In some embodiments, the capping layer 136 is or otherwise includes the same material as the buffer layer 116 and/or the dielectric grid layer 132. For example, in some embodiments without the etch stop layer 134, the capping layer 136 and the dielectric grid layer 132 may share a molecular structure and/or correspond to different regions of the same layer (e.g., a layer formed by a single deposition).

Color filters 140A, 142A, 144A corresponding to the pixel sensors 104A are arranged in the dielectric grid openings 128A to fill the dielectric grid openings 128A. The color filters 140A, 142A, 144A typically have planar upper surfaces that are approximately coplanar with an upper surface of the dielectric grid layer 132. The color filters 140A, 142A, 144A are assigned corresponding colors or wavelengths of radiation (e.g., light), and configured to transmit the assigned colors or wavelengths of radiation to the corresponding pixel sensors 104A. Typically, the color filter assignments alternate between red, green, and blue, such that the color filters include blue color filters 140A, red color filters 142A, and green color filters 144A. In some embodiments, the color filter assignments alternative between red, green, and blue light according to a Bayer mosaic. Typically, the color filters 140A, 142A, 144A are of a first material with a refractive index different (e.g., higher) than that of a second material abutting the first material along sidewalls of the dielectric grid openings 128A. The second material may be, for example, that of the dielectric grid layer 132.

Micro lenses 146A corresponding to the pixel sensors 104A are arranged over the color filters 140A, 142A, 144A and the pixel sensors 104A. Centers of the micro lenses 146A are typically aligned with centers of the color filters 140A, 142A, 144A, but centers of the micro lenses 146A may be laterally shifted or offset from centers of the color filters 140A, 142A, 144A. The micro lenses 146A are configured to focus incident radiation (e.g., light) towards the pixel sensors 104A and/or the color filters 140A, 142A, 144A. In some embodiments, the micro lenses 146A have convex upper surfaces configured to focus radiation towards the pixel sensors 104A and/or the color filters 140A, 142A, 144A.

By shifting the metallic and dielectric grid openings 126A, 128A based on pixel sensor position, the uniformity of optical input to the pixel sensors 104A may advantageously be improved. Instead of blocking certain incident radiation, the metallic and dielectric grids 122A, 124A may better direct the radiation to the pixel sensors 104A. For example, as illustrated, a light ray 148 from a point light source overlying a center of the pixel sensor array 102 may enter a color filter 144A at a steep angle of incidence, while still having a direct path to the corresponding pixel sensor 104A of the color filter 144A. Further, by shifting the metallic and dielectric grid openings 126A, 128A based on pixel sensor position, optical performance may be improved (e.g., SNR-10). Even more, by independently shifting both the metallic and dielectric grid openings 126A, 128A design flexibly for large BSI image sensors is improved.

Figure 1B:
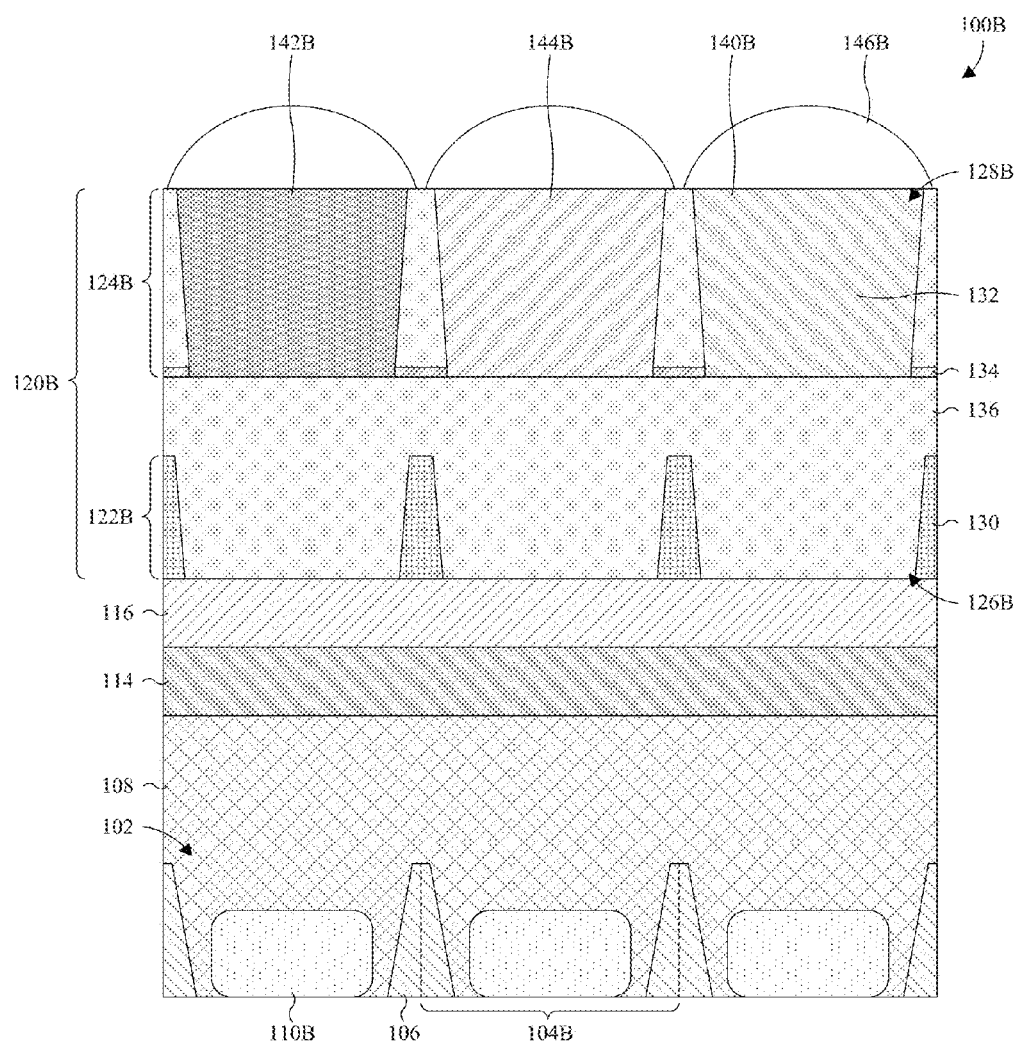
FIG. 1B illustrates a cross-sectional view of some embodiments of a BSI image sensor without stacked grid shifting.

With reference to FIG. 1B, a cross-sectional view 100B of some embodiments of a BSI image sensor without stacked grid shifting is provided. These other embodiments may, for example, be viewed as having shift amounts $S_1$, $S_1'$, $S_2$, $S_2'$ equal to about zero. The BSI image sensor includes a stacked grid 120B arranged over an ARC 114 and/or a buffer layer 116. The stacked grid 120B includes a metallic grid 122B and a dielectric grid 124B overlying the metallic grid 122B. The metallic grid 122B and the dielectric grid 124B are vertically aligned to an isolation grid 106 laterally surrounding underlying pixel sensors 104B, including corresponding photodetectors 110B. Further, the metallic grid 122B and the dielectric grid 124B respectively define sidewalls of metallic and dielectric grid openings 126B, 128B centered over centers of the pixel sensors 104B. Color filters 140B, 142B, 144B corresponding to the pixel sensors 104B are arranged in the dielectric grid openings 128B, and micro lenses 146B corresponding to the pixel sensors 104B are arranged over the color filters 140B, 142B, 144B.

Figure 2:
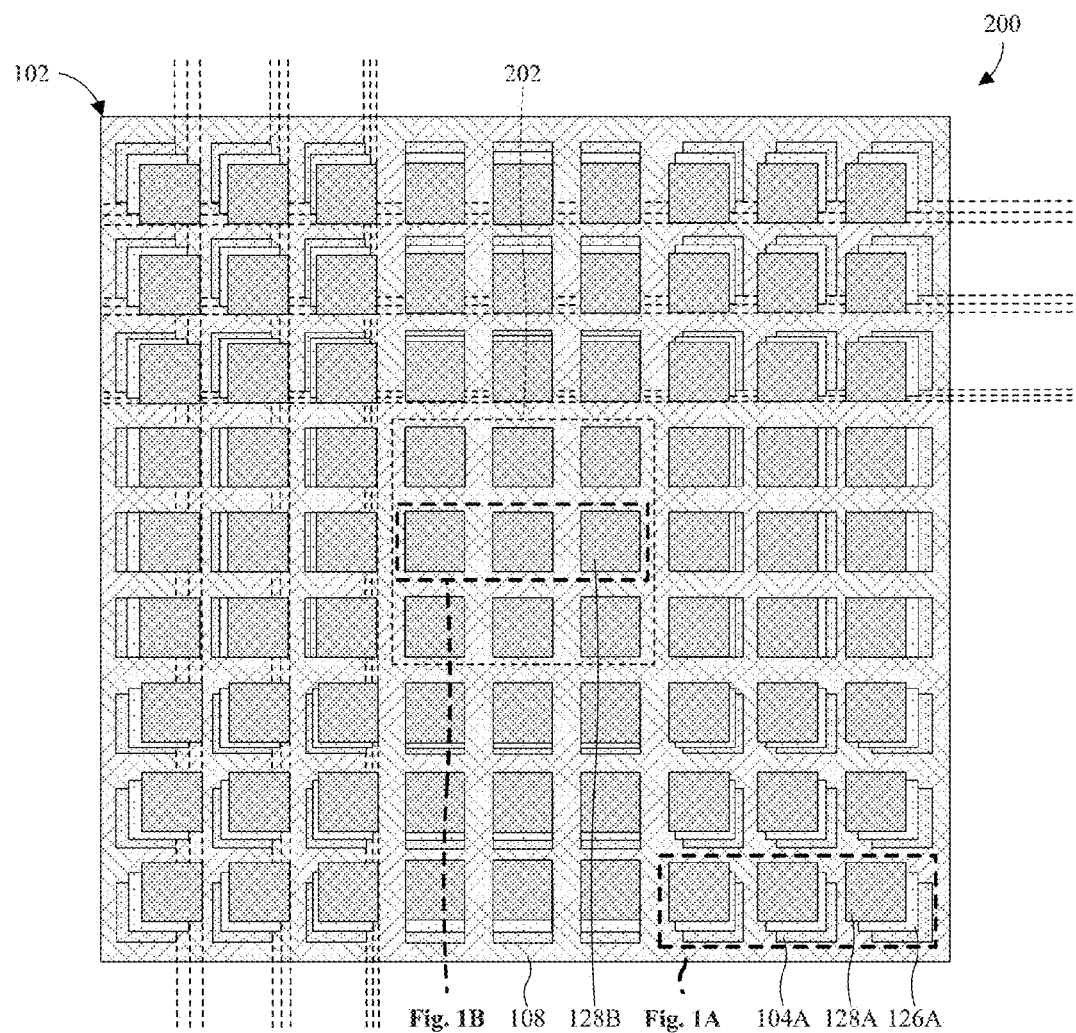
FIG. 2 illustrates a top view of some embodiments of a BSI image sensor.

With reference to FIG. 2, a top view 200 of some embodiments of a BSI image sensor is provided. The BSI image sensor includes an array 102 of pixel sensors 104A arranged in rows and/or columns within a semiconductor substrate 108. For example, the pixel sensor array 102 may include about nine rows and thirteen columns arranged in the semiconductor substrate 108. Further, the BSI image sensor includes metallic grid openings 126A and dielectric grid openings 128A, 128B corresponding to the pixel sensors 104A and stacked over the corresponding pixel sensors 104A. A center 202 of the BSI image sensor is configured according to the embodiments of FIG. 1B, and the peripheral region of the BSI image sensor is configured according to the embodiments of FIG. 1A. For example, as illustrated, shift amounts may increase from zero, at the center 202, to an edge of the BSI image sensor.

Figure 3:
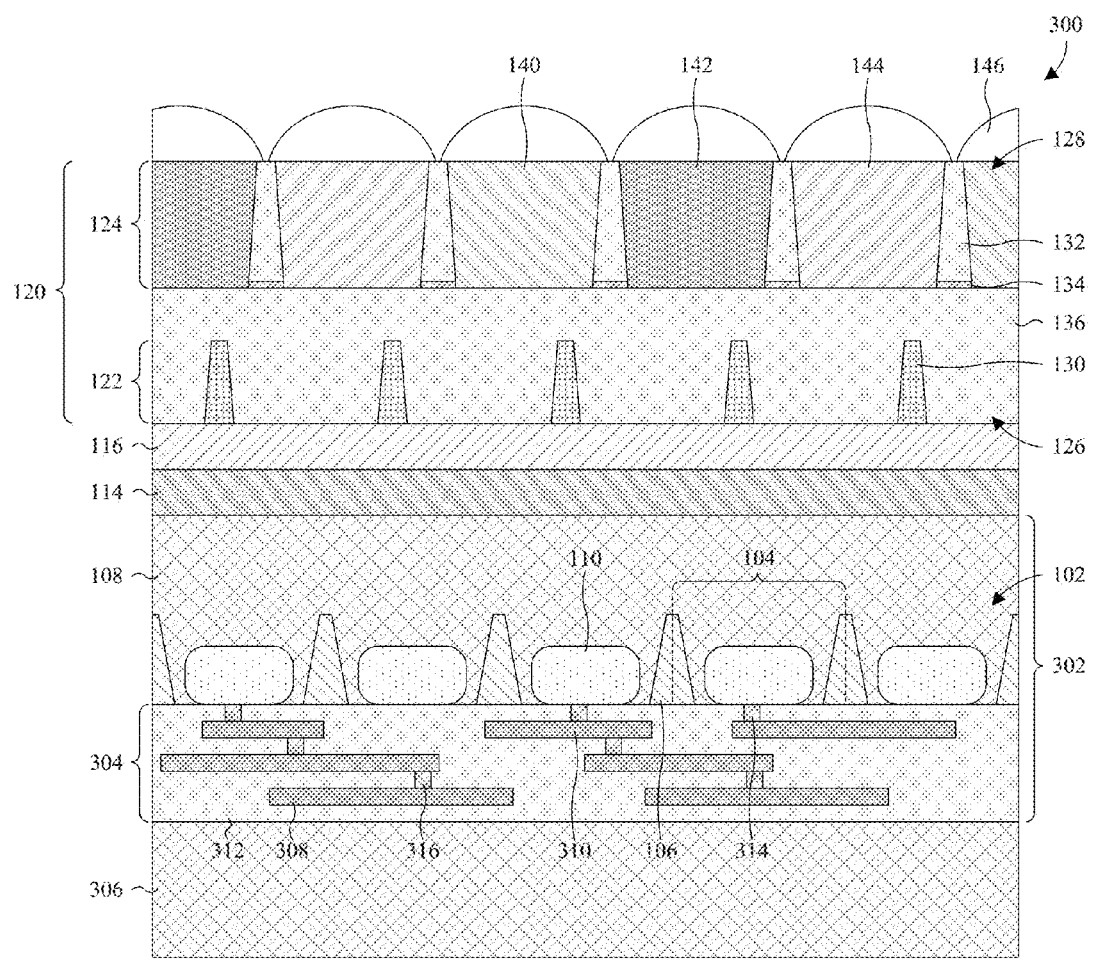
FIG. 3 illustrates a cross-sectional view of some embodiments of a BSI image sensor.

With reference to FIG. 3, a cross-sectional view 300 of some embodiments of a BSI image sensor is provided. The BSI image sensor includes an array 102 of pixel sensors 104 and an isolation grid 106 arranged in a semiconductor substrate 108 of an integrated circuit 302 between a back side of the integrated circuit 302 and a BEOL metallization stack 304 of the integrated circuit 302. The pixel sensors 104 are arranged in rows and/or columns within the semiconductor substrate 108, and configured to convert incident radiation (e.g., photons) into electrical signals. The pixel sensors 104 include corresponding photodetectors 110 and, in some embodiments, corresponding amplifiers (not shown). The pixel sensors 104 may correspond to the pixel sensors 104A of FIG. 1A, and/or the pixel sensors 104B of FIG. 1B. The isolation grid 106 extends into the semiconductor substrate 108 proximate the BEOL metallization stack 304, and laterally surrounds the pixel sensors 104. The isolation grid 106 is configured to isolate the pixel sensors 104 from one another, and made up of abutting isolation grid segments, such as rectangles or squares, corresponding to the pixel sensors 104.

The BEOL metallization stack 304 underlies the semiconductor substrate 108 between the semiconductor substrate 108 and a carrier substrate 306. The BEOL metallization stack 304 includes a plurality of metallization layers 308, 310 stacked within an interlayer dielectric (ILD) layer 312. One or more contacts 314 of the BEOL metallization stack 304 extend from a metallization layer 310 to the pixel sensors 104. Further, one or more vias 316 of the BEOL metallization stack 304 extend between the metallization layers 308, 310 to interconnect the metallization layers 308, 310. The ILD layer 312 may be, for example, a low κ dielectric (i.e., a dielectric with a dielectric constant less than about 3.9) or an oxide. The metallization layers 308, 310, the contacts 314, and the vias 316 may be, for example, a metal, such as copper, aluminum, or aluminum copper.

An ARC 114 and/or a buffer layer 116 are arranged along the back side of the integrated circuit 302, and a stacked grid 120 is arranged over the ARC 114 and/or the buffer layer 116. The stacked grid 120 may correspond to the stacked grid 120A of FIG. 1A, and/or the stacked grid 120B of FIG. 1B. The stacked grid 120 includes a metallic grid 122 and a dielectric grid 124 overlying the metallic grid 122. The metallic grid 122 and the dielectric grid 124 are respectively arranged within metallic and dielectric grid layers 130, 132 stacked over the ARC 114 and/or the buffer layer 116. Further, the metallic grid 122 and the dielectric grid 124 respectively define sidewalls for metallic grid openings 126 and dielectric grid openings 128 corresponding to the pixel sensors 104. In some embodiments, the metallic and dielectric grid openings 126, 128 are centered over the corresponding pixel sensors 104. In other embodiments, the metallic and dielectric grid openings 126, 128 are laterally shifted relative to the corresponding pixel sensors 104. For example, the metallic and dielectric grid openings 126, 128 may be laterally shifted in proportion to the distances of the corresponding pixel sensors 104 from a center of the pixel sensor array 102.

A capping layer 136 is arranged over the metallic grid layer 130 between the metallic grid layer 130 and the dielectric grid layer 132. Further, color filters 140, 142, 144 and micro lenses 146 corresponding to the pixel sensors 104 are arranged over the corresponding pixel sensors 104. The color filters 140, 142, 144 fill the dielectric grid openings 128, and the micro lenses 146 mask the color filters 140, 142, 144 to focus light into the color filters 140, 142, 144.

Figure 4:
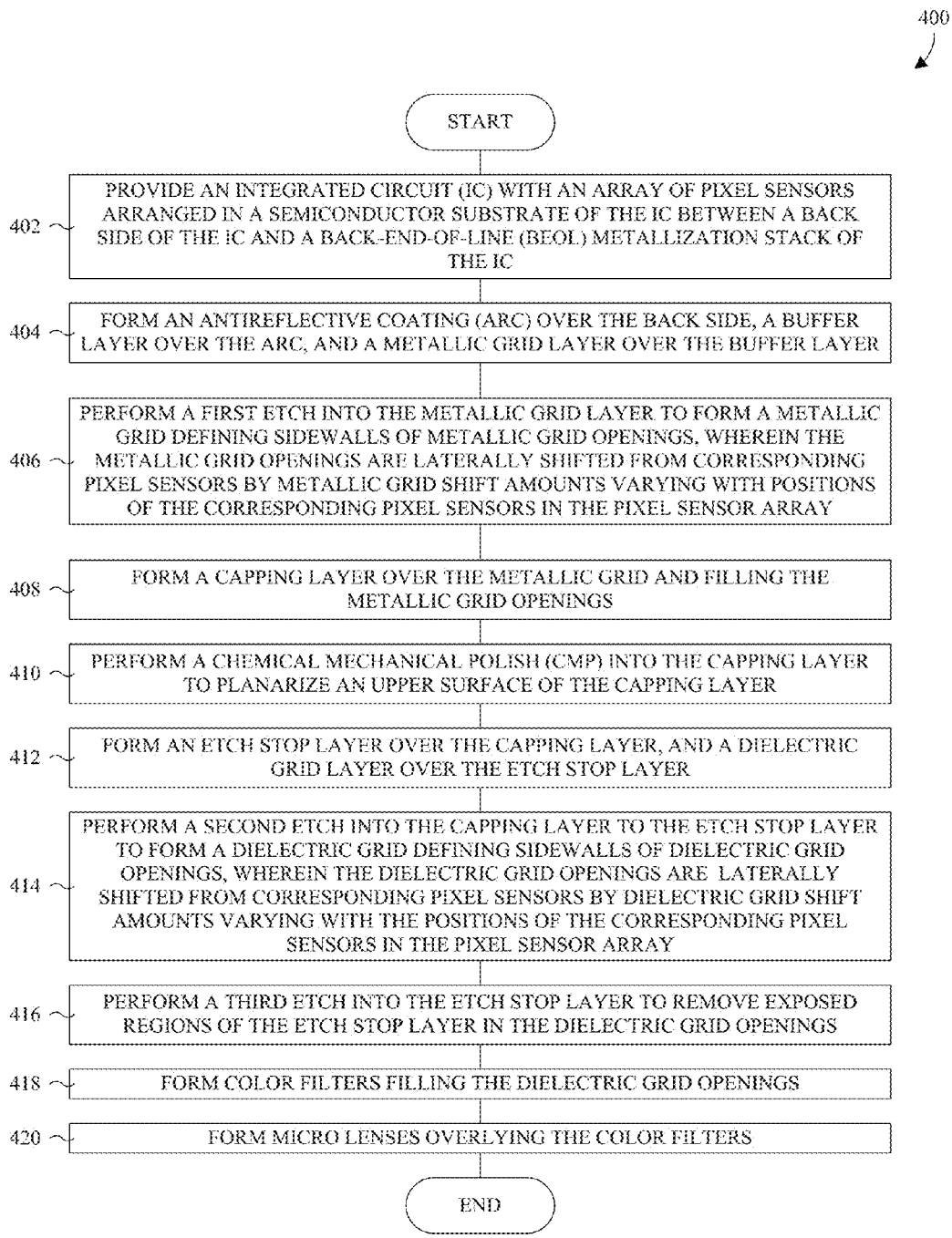
FIG. 4 illustrates a flowchart of some embodiments of a method for manufacturing a BSI image sensor with stacked grid shifting.

With reference to FIG. 4, a flowchart 400 of some embodiments of a method for manufacturing a BSI image sensor with stacked grid shifting is provided.

At 402, an integrated circuit is provided with an array of pixel sensors arranged in a semiconductor substrate of the integrated circuit between a back side of the integrated circuit and a BEOL metallization stack of the integrated circuit.

At 404, an ARC is formed over the back side, a buffer layer is formed over the ARC, and a metallic grid layer is formed over the buffer layer.

At 406, a first etch is performed into the metallic grid layer to form a metallic grid defining sidewalls of metallic grid openings. The metallic grid openings are laterally shifted from corresponding pixel sensors by metallic grid shift amounts varying with positions of the corresponding pixel sensors in the pixel sensor array.

At 408, a capping layer is formed over the metallic grid and filling the metallic grid openings.

At 410, a chemical mechanical polish (CMP) is performed into the capping layer to planarize an upper surface of the capping layer.

At 412, an etch stop layer is formed over the capping layer, and a dielectric grid layer is formed over the etch stop layer.

At 414, a second etch is performed into the dielectric grid layer to the etch stop layer to form a dielectric grid defining dielectric grid openings. The dielectric grid openings are laterally shifted from corresponding pixel sensors by dielectric grid shift amounts varying with the positions of the corresponding pixel sensors in the pixel sensor array.

At 416, a third etch is performed into the etch stop layer to remove exposed regions of the etch stop layer in the dielectric grid openings At 418, color filters are formed filling the dielectric grid openings.

At 420, micro lenses are formed overlying the color filters

By laterally shifting the metallic and dielectric grid openings by amounts dependent upon positions of the pixel sensors in the pixel sensor array, the uniformity of optical input to the pixel sensors can advantageously be increased. The improved uniformity in optical input, in turn, leads to improved optical performance (e.g., SNR-10). Further, by laterally shifting both the metallic grid opening and the dielectric grid opening, design flexibility is improved for larger BSI image sensors.

While the method described by the flowchart 400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some alternative embodiments, the second and third etches may be performed together (e.g., with a common etchant). Further, in some alternative embodiments, the etch stop layer and Act 416 may be omitted. In such embodiments, the second etch may be time based using known etch rates. Moreover, in some alternative embodiments, Act 416 may be omitted, but the etch stop layer may remain. Even more, in some alternative embodiments, the capping layer and the dielectric grid layer may correspond to different regions of a common layer. In such embodiments, Acts 408, 410, 412 may be omitted. In place of Acts 408, 410, 412, a common layer may formed (e.g., with a single deposition) over the metallic grid and filling the metallic grid openings.

Further, a CMP may performed into the common layer to planarize an upper surface of the common layer, and Acts 414-420 may be performed.

With reference to FIGS. 5-12, cross-sectional views of some embodiments of a BSI image sensor at various stages of manufacture are provided to illustrate the method of FIG. 4. Although FIGS. 5-12 are described in relation to the methods, it will be appreciated that the structures disclosed in FIGS. 5-12 are not limited to the methods, but instead may stand alone as structures independent of the methods. Similarly, although the methods are described in relation to FIGS. 5-12, it will be appreciated that the methods are not limited to the structures disclosed in FIGS. 5-12, but instead may stand alone independent of the structures disclosed in FIGS. 5-12.

Figure 5:
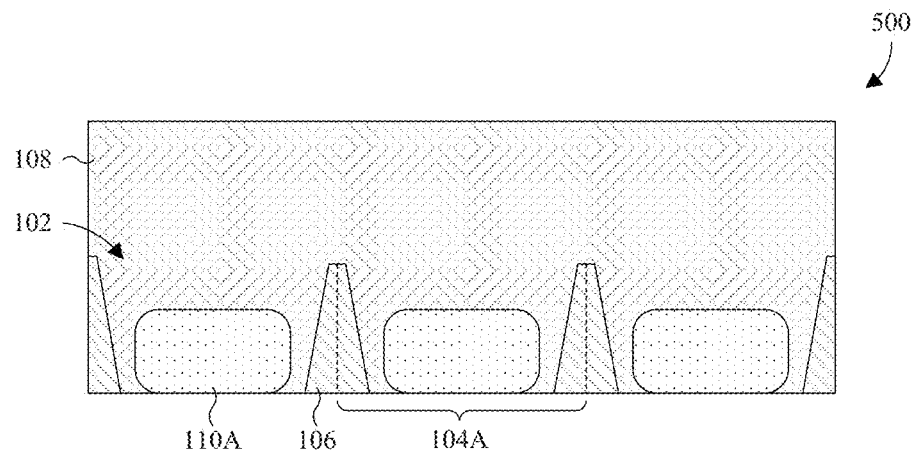
FIGS. 5-12 illustrate a series of cross-sectional views of some embodiments of a BSI image sensor at various stages of manufacture.

FIG. 5 illustrates a cross-sectional view 500 of some embodiments corresponding to Act 402. As illustrated, a semiconductor substrate 108 with an array 102 of pixel sensors 104A and an isolation grid 106 arranged within the substrate 108 is provided. In some embodiments, the semiconductor substrate 108 is part of an integrated circuit, and the pixel sensors 104A and the isolation grid 106 are arranged between a back side of the integrated circuit and a BEOL metallization stack (not shown) of the integrated circuit. The pixel sensors 104A are arranged in rows and/or columns within the semiconductor substrate 108, and include corresponding photodetectors 110A. The isolation grid 106 extends into the semiconductor substrate 108 and laterally surrounds the pixel sensors 104A. The semiconductor substrate 108 may be, for example, a bulk semiconductor substrate or a silicon-on-insulator (SOI) substrate.

Figure 6:
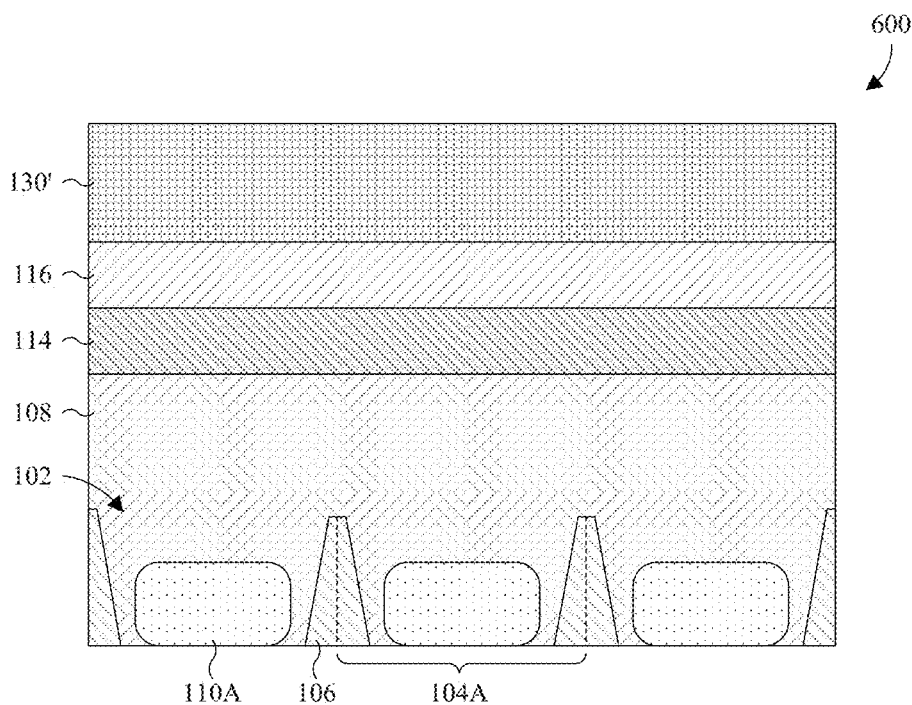

FIG. 6 illustrates a cross-sectional view 600 of some embodiments corresponding to Act 404. As illustrated, an ARC 114 and/or a buffer layer 116 are formed stacked in that order over the semiconductor substrate 108. Further, a metallic grid layer 130' is formed over the ARC 114 and/or the buffer layer 116. The ARC 114, the buffer layer 116, and the metallic grid layer 130' may be sequentially formed by deposition techniques, such as spin coating or vapor deposition. The ARC 114 may be formed of, for example, an organic polymer or a metallic oxide. The buffer layer 116 may be formed of, for example, an oxide, such as silicon dioxide. The metallic grid layer 130' may be formed of, for example, tungsten, copper, aluminum, or aluminum copper.

Figure 7:
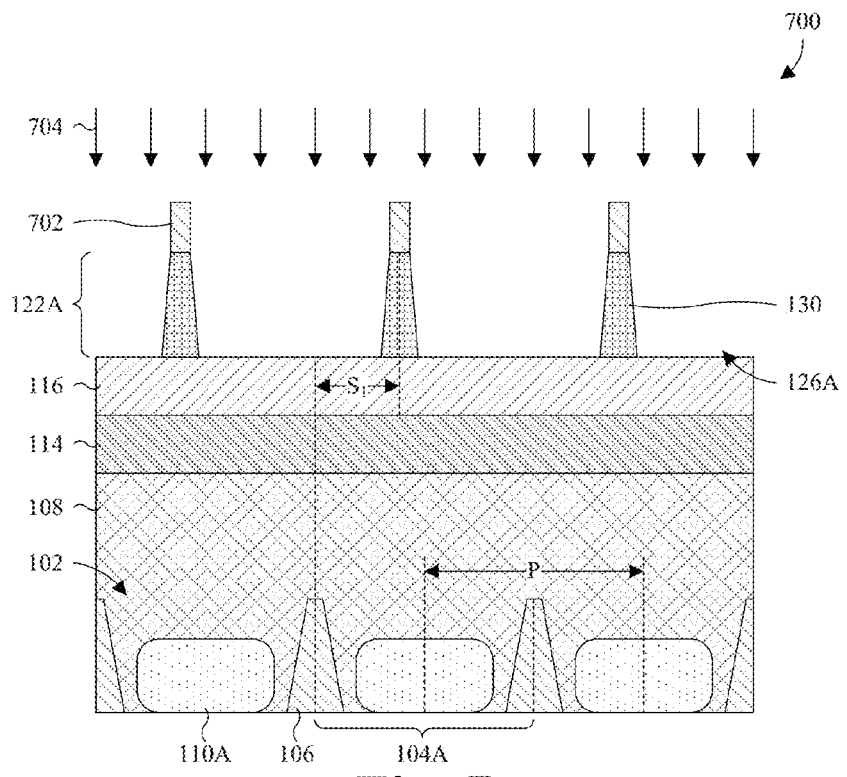

FIG. 7 illustrates a cross-sectional view 700 of some embodiments corresponding to Act 406. As illustrated, a first etch is performed into the metallic grid layer 130' (see FIG. 6) to form a metallic grid 122A defining sidewalls for metallic grid openings 126A. The metallic grid openings 126A correspond to the pixel sensors 104A, and typically overly the corresponding pixel sensors 104A at least partially. Further, the metallic grid openings 126A are laterally shifted from the corresponding pixel sensors 104A by metallic grid shift amounts $S_1$. In some embodiments, as illustrated, the metallic grid shift amounts $S_1$ are relative to the isolation grid 106 and the metallic grid 122A. In alternative embodiments, the metallic grid shift amounts $S_1$ are relative to centers of the pixel sensors 104A and the metallic grid openings 126A. The metallic grid shift amounts $S_1$ vary depending upon the locations of the pixel sensors in the pixel sensor array 102. For example, the metallic grid shift amounts $S_1$ may be proportional to the distances of the pixel sensors 104A from a center of the pixel sensor array 102. Further, in some embodiments, ratios of the metallic grid shift amounts $S_1$ to a pitch P of the pixel sensors 104A (i.e., ratios of $S_1/P$) are between about 0 and about 3.

The process for performing the first etch may include forming a first photoresist layer 702 masking regions of the metallic grid layer 130' corresponding to the metallic grid 122A. An etchant 704 may then be applied to the metallic grid layer 130' according to a pattern of the first photoresist layer 702, thereby defining the metallic grid 122A. The etchant 704 may be selective of the metallic grid layer 130' relative to the ARC 114 and/or the buffer layer 116. Further, the etchant 704 may be, for example, a dry etchant. After applying the etchant 704, the first photoresist layer 702 may be removed.

Figure 8:
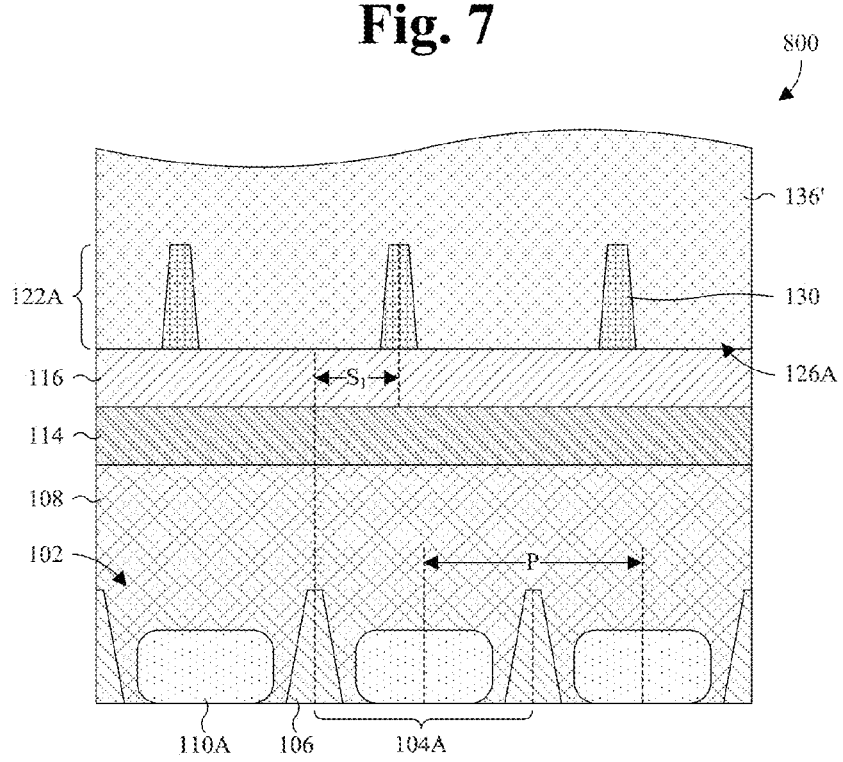

FIG. 8 illustrates a cross-sectional view 800 of some embodiments corresponding to Act 408. As illustrated, a capping layer 136' is formed over the metallic grid 122A and the remaining metallic grid layer 130, and filling the metallic grid openings 126A. The capping layer 136' may be formed of, for example, a dielectric, such as an oxide, and/or may be formed of, for example, the same material as the buffer layer 116. Further, the capping layer 136' may be formed using, for example, a deposition technique, such as spin coating or vapor deposition.

Figure 9:
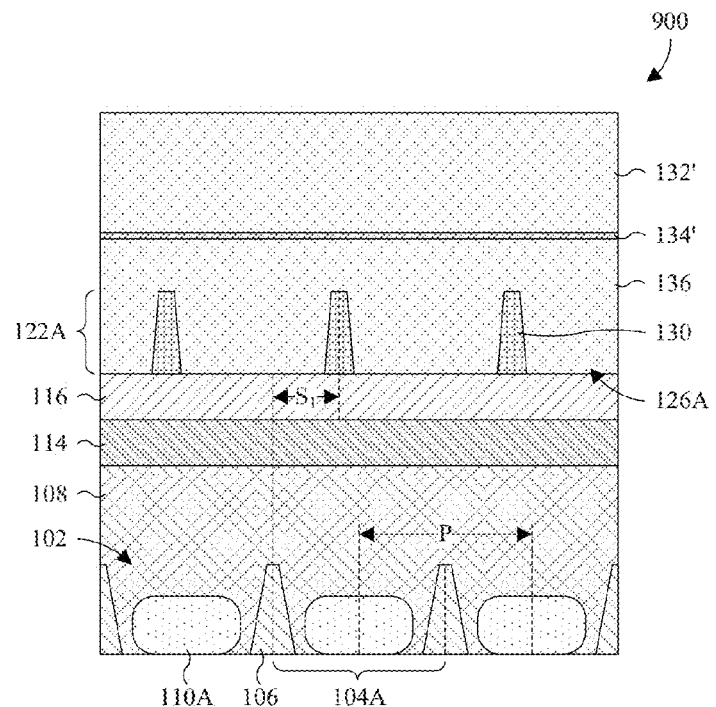

FIG. 9 illustrates a cross-sectional view 900 of some embodiments corresponding to Acts 410 and 412. As illustrated, a CMP is performed into the capping layer 136' (see FIG. 8) to a point over the remaining metallic grid layer 130, thereby resulting in a substantially planar upper surface. Also illustrated, an etch stop layer 134' and a dielectric grid layer 132' are formed stacked in that order over the remaining capping layer 136. The etch stop layer 134' and the dielectric grid layer 132' may be formed using, for example, a deposition technique, such as vapor deposition. The etch stop layer 134' may be formed of, for example, a nitride, such as silicon nitride. The dielectric grid layer 132' may be formed of, for example, silicon dioxide, and/or may be formed of, for example, the same material as the remaining capping layer 136. In alternative embodiments, the etch stop layer 134' may be omitted.

Figure 10:
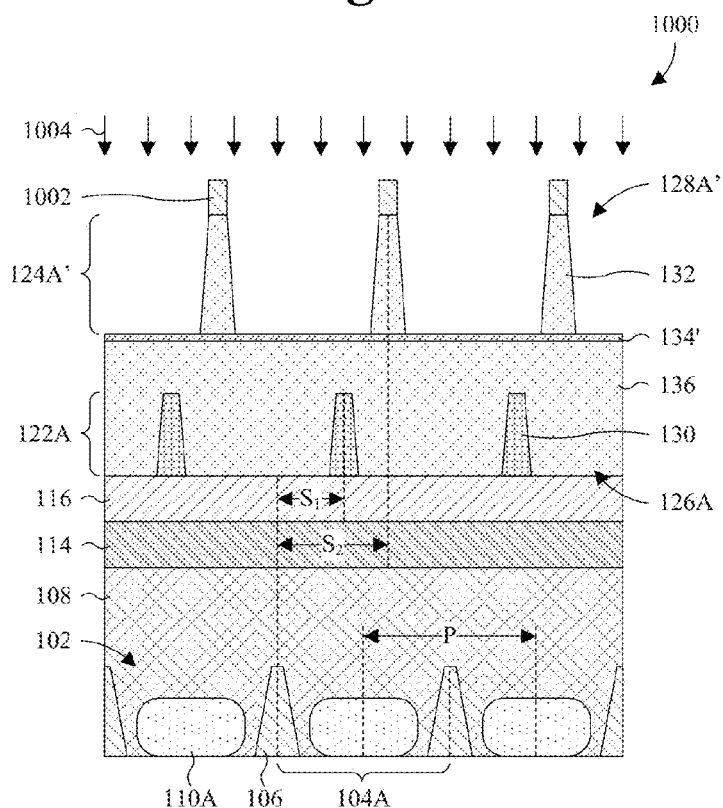

FIG. 10 illustrates a cross-sectional view 1000 of some embodiments corresponding to Act 414. As illustrated, a second etch is performed into the dielectric grid layer 132' (see FIG. 9) to the etch stop layer 134' to form a dielectric grid 124A' defining sidewalls for dielectric grid openings 128A'. The dielectric grid openings 128A' correspond to the pixel sensors 104A and are laterally shifted from the corresponding pixel sensors 104A by dielectric grid shift amounts $S_2$, which are typically greater than the metallic grid shift amounts $S_1$. In some embodiments, as illustrated, the dielectric grid shift amounts $S_2$ are relative to the isolation grid 106 and the metallic grid 122A. In alternative embodiments, the dielectric grid shift amounts $S_2$ are relative to centers of the pixel sensors 104A and the metallic grid openings 126A. The dielectric grid shift amounts $S_2$ vary depending upon the locations of the pixel sensors 104A in the pixel sensor array 102. For example, the dielectric grid shift amounts $S_2$ may be proportional to the distances of the pixel sensors 104 from a center of the pixel sensor array 102. Further, in some embodiments, ratios of the dielectric grid shift amounts $S_2$ to the pitch P of the pixel sensors 104A (i.e., ratios of $S_2/P$) are between about 0 and about 3.

The process for performing the second etch may include forming a second photoresist layer 1002 masking regions of the dielectric grid layer 132' corresponding to the dielectric grid 124A'. An etchant 1004 may then be applied to the dielectric grid layer 132' according to a pattern of the second photoresist layer 1002, thereby defining the dielectric grid 124A'. The etchant 1004 may be selective of the dielectric grid layer 132' relative to the etch stop layer 134'. Further, the etchant 1004 may be, for example, a dry etchant. After applying the etchant 1004, the second photoresist layer 1002 may be removed.

Figure 11:
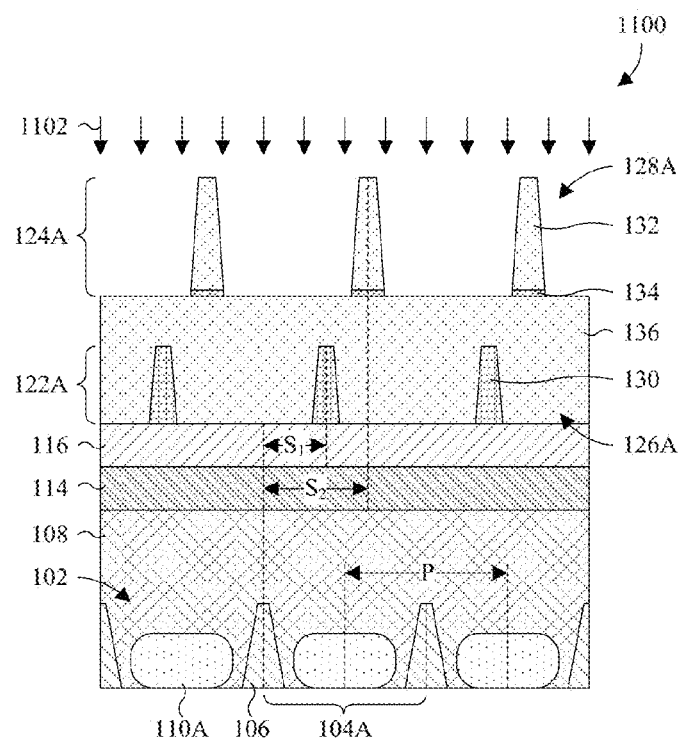

FIG. 11 illustrates a cross-sectional view 1100 of some embodiments corresponding to Act 416. As illustrated, a third etch is performed into the etch stop layer 134' (see FIG. 10), through exposed regions in the dielectric grid openings 128A' (see FIG. 10), to the remaining capping layer 136. The third etch removes regions of the etch stop layer 134' in the dielectric grid openings 128A'. The process for performing the third etch may include, for example, applying an etchant 1102 to the etch stop layer 134'. The etchant 1102 may be selective of the etch stop layer 134' relative to the remaining dielectric grid layer 132 and/or the remaining capping layer 136. Further, the etchant 1102 may be, for example, a wet etchant.

Figure 12:
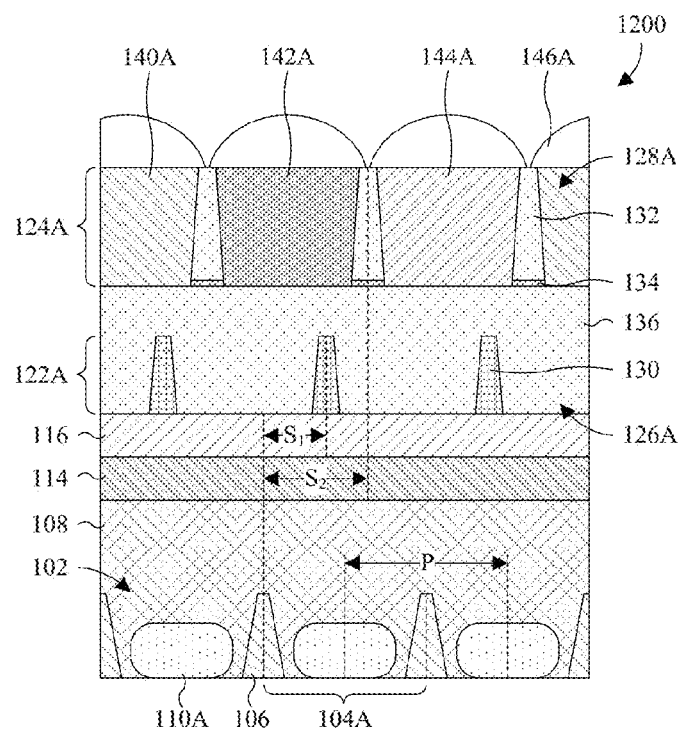

FIG. 12 illustrates a cross-sectional view 1200 of some embodiments corresponding to Acts 418 and 420.

As illustrated by FIG. 12, color filters 140A, 142A, 144A corresponding to the pixel sensors 104A are formed in the remaining dielectric grid openings 128A of the corresponding pixel sensors 104A, typically with upper surfaces approximately even with an upper surface of the remaining dielectric grid layer 132. The color filters 140A, 142A, 144A are assigned corresponding colors or wavelengths of radiation (e.g., according to a Bayer mosaic), and formed of materials configured to transmit the assigned colors or wavelengths of radiation to the corresponding pixel sensors 104A. Further, the color filters 140A, 142A, 144A are typically formed with materials having refractive indexes different (e.g., higher) than the remaining dielectric grid layer 132' The process for forming the color filters 140A, 142A, 144A may include, for each of the different color filter assignments, forming a color filter layer and patterning the color filter layer. The color filter layer may be formed so as to fill the remaining dielectric grid openings and to cover the remaining dielectric grid layer 132. The color filter layer may then be planarized (e.g., by CMP) and/or etched back to about even with the upper surface of the remaining dielectric grid layer 132, before patterning the color filter layer.

As also illustrated by FIG. 12, micro lenses 146A corresponding to the pixel sensors 104A are formed over the color filters 140A, 142A, 144A of the corresponding pixel sensors 104A. The process for forming the micro lenses 146A may include forming a micro lens layer above the color filters 140A, 142A, 144A (e.g., by a spin-on method or a deposition process). Further, a micro lens template having a curved upper surface may be patterned above the micro lens layer. The micro lens layer may then be selectively etched according to the micro lens template to form the micro lenses 146A.

Thus, as can be appreciated from above, the present disclosure provides an image sensor. A pixel sensor is arranged within a semiconductor substrate. A metallic grid segment is arranged over the pixel sensor and has a metallic grid opening therein. A center of the metallic grid opening is laterally shifted from a center of the pixel sensor. A dielectric grid segment is arranged over the metallic grid and has a dielectric grid opening therein. A center of the dielectric grid opening is laterally shifted from the center of the pixel sensor.

In other embodiments, the present disclosure provides a method of forming an image sensor. A pixel sensor arranged within a semiconductor substrate is provided. A metallic grid layer is formed over the semiconductor substrate. A first etch is performed into the metallic grid layer to form a metallic grid over the semiconductor substrate and defining a sidewall of a metallic grid opening. The metallic grid opening has a center laterally shifted from a center of the pixel sensor. A dielectric grid layer is formed over the metallic grid. A second etch is performed into the dielectric grid layer to form a dielectric grid over the metallic grid and defining a sidewall of a dielectric grid opening. The dielectric grid has a center laterally shifted from the center of the pixel sensor.

In yet other embodiments, the present disclosure provides an image sensor. A plurality of pixel sensors are arranged as an array within a semiconductor substrate. A metallic grid is arranged over the array of pixel sensors and has a plurality of metallic grid openings corresponding to the plurality of pixel sensors. Centers of the metallic grid openings near an edge of the array are laterally shifted from centers of the corresponding pixel sensors by metallic grid shift amounts that are proportional to distances of corresponding pixel sensors from a center of the array. A dielectric grid is arranged over the metallic grid and has a plurality of dielectric grid openings corresponding to the plurality of pixel sensors. Centers of the dielectric grid openings near the edge of the array are laterally shifted from centers of the corresponding pixel sensors by dielectric grid shift amounts that are proportional to the distances of corresponding pixel sensors from the center of the array. The metallic grid shift amount for a pixel sensor differs from the dielectric grid shift amount for the pixel sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
    a pixel sensor arranged within a semiconductor substrate;
    a metallic grid segment arranged over the pixel sensor and having a metallic grid opening therein, wherein a center of the metallic grid opening is laterally shifted from a center of the pixel sensor by a metallic grid shift amount; and
    a dielectric grid segment arranged over the metallic grid segment and having a dielectric grid opening therein, wherein a center of the dielectric grid opening is laterally shifted from the center of the pixel sensor by a dielectric grid shift amount, wherein the center of the dielectric grid opening is laterally shifted from the center of the pixel sensor in multiple orthogonal directions, and wherein the dielectric grid shift amount is different than the metallic grid shift amount.

2. The image sensor according to claim 1, wherein the pixel sensor is part of a pixel sensor array made up of a plurality of pixel sensors;
    wherein the metallic grid segment is part of a metallic grid made up of a plurality of metallic grid segments with a plurality of respective metallic grid openings therein;
    wherein the dielectric grid segment is part of a dielectric grid made up of a plurality of dielectric grid segments with a plurality of respective dielectric grid openings therein;
    wherein the metallic and dielectric grid shift amounts are proportional to a distance of the pixel sensor from a center of the pixel sensor array.

3. The image sensor according to claim 1, further including:
    a pixel sensor array including the pixel sensor and a second pixel sensor neighboring the pixel sensor;
    wherein the center of the pixel sensor is separated from a center of the second pixel sensor by a pixel pitch distance, wherein ratios of the metallic and dielectric grid shift amounts to the pixel pitch distance are between about 0 and about 3.

4. The image sensor according to claim 1, further comprising:
    a color filter arranged within and filling the dielectric grid opening with a top surface that is even with a top surface of the dielectric grid segment; and
    a micro lens having a curved upper surface and a substantially planar lower surface abutting a substantially planar upper surface of the color filter.

5. The image sensor according to claim 1, further including:
    a capping layer arranged over the metallic grid segment, and defining a lower surface of the dielectric grid opening; and
    an etch stop layer overlying the capping layer, wherein sidewalls of the dielectric grid segment are aligned to sidewalls of the etch stop layer, and wherein the etch stop layer is a different material than the dielectric grid segment.

6. The image sensor according to claim 1, further comprising:
    a back-end-of-line (BEOL) metallization stack arranged on an opposite side of the semiconductor substrate as the metallic grid segment.

7. The image sensor according to claim 1, further including:
    a second pixel sensor arranged within the semiconductor substrate;
    a second metallic grid segment having a second metallic grid opening therein, the second metallic grid opening centered over a center of the second pixel sensor; and
    a second dielectric grid segment having a second dielectric grid opening therein, the second dielectric grid opening centered over the center of the second pixel sensor.

8. An image sensor comprising:
    a plurality of pixel sensors arranged as an array within a semiconductor substrate;
    a metallic grid arranged over the array of pixel sensors and having a plurality of metallic grid openings corresponding to the plurality of pixel sensors, wherein centers of the metallic grid openings near an edge of the array are laterally shifted from centers of the corresponding pixel sensors by metallic grid shift amounts that are proportional to distances of corresponding pixel sensors from a center of the array; and
    a dielectric grid arranged over the metallic grid and having a plurality of dielectric grid openings corresponding to the plurality of pixel sensors, wherein centers of the dielectric grid openings near the edge of the array are laterally shifted from centers of the corresponding pixel sensors by dielectric grid shift amounts that are proportional to the distances of corresponding pixel sensors from the center of the array;
wherein a metallic grid shift amount for one of the pixel sensors differs from a dielectric grid shift amount for the one of the pixel sensors, and wherein the centers of the metallic and dielectric grid openings near the edge of the array are laterally shifted from the centers of the corresponding pixel sensor in multiple orthogonal directions.

9. The image sensor according to claim 8, wherein centers of the metallic grid openings near a central region of the array are aligned with centers of the corresponding pixel sensors in the central region of the array.

10. The image sensor according to claim 1, wherein the metallic and dielectric grid segments are respectively regions of a metal layer and a dielectric layer, wherein the regions laterally surround the metallic and dielectric grid openings, and wherein the metal and dielectric layers comprise respective metallic and dielectric grid patterns.

11. The image sensor according to claim 10, wherein the metallic and dielectric grid patterns are respectively defined by arrays of abutting grid segments, and wherein the abutting grid segments include the metallic and dielectric grid segments.

12. The image sensor according to claim 8, further comprising:
a capping layer covering the metallic grid, filling the metallic grid openings, and defining a lower surface of the dielectric grid openings.

13. The image sensor according to claim 8, further comprising:
a carrier substrate arranged under the semiconductor substrate; and
a back-end-of-line (BEOL) metallization stack arranged over the carrier substrate, between the carrier substrate and the semiconductor substrate.

14. An image sensor comprising:
a semiconductor substrate arranged over a back-end-of-line (BEOL) metallization stack, and comprising an array of pixel sensors arranged in the semiconductor substrate;
a metallic grid arranged over the semiconductor substrate and comprising an array of metallic grid segments, wherein the metallic grid segments correspond to the pixel sensors and are laterally offset from the corresponding pixel sensors;
a capping layer covering the metallic grid and filling metallic grid openings respectively in the metal grid segments, wherein the metallic grid openings comprise a pair of neighboring metallic grid openings laterally spaced by a region of the metallic grid that has a trapezoidal cross-sectional profile and that is vertically elongated; and
a dielectric grid arranged over the capping layer and comprising an array of dielectric grid segments, wherein the dielectric grid segments correspond to the metallic grid segments and are laterally offset from the corresponding metallic grid segments, wherein the dielectric grid further comprises a pair of neighboring dielectric grid openings, wherein the neighboring dielectric grid openings are laterally spaced by a line-shaped region of the dielectric grid that has opposite sidewalls respectively in the neighboring dielectric grid openings, and wherein the opposite sidewalls are directly over one of the pixel sensors.

15. The image sensor according to claim 14, wherein the metallic grid segments are respectively regions of a metal layer that laterally surround the metallic grid openings, and wherein the dielectric grid segments are respectively regions of a dielectric layer that laterally surround respective dielectric grid openings.

16. The image sensor according to claim 1, further comprising:
a second metallic grid segment arranged over the semiconductor substrate and adjoining the metallic grid segment, wherein the second metallic grid segment has a second metallic grid opening laterally spaced from the metallic grid opening by a common region of the metallic grid segment and of the second metallic grid segment, and wherein the common region has a trapezoidal cross-sectional profile and is vertically elongated.

17. The image sensor according to claim 8, wherein the pixel sensors comprise a first pixel sensor and a second pixel sensor neighboring the first pixel sensor, and wherein the image sensor further comprises:
a plurality of color filters arranged within corresponding ones of the dielectric grid openings, wherein the color filters comprise a first color filter and a second color filter partially covering the first and second pixel sensors, respectively, wherein the first and second color filters are laterally spaced by a line-shaped dielectric region of the dielectric grid and contact opposite sidewalls of the line-shaped dielectric region, respectively, and wherein the opposite sidewalls are directly over the first pixel sensor.

18. The image sensor according to claim 14, wherein the metallic grid further comprises a pair of neighboring metallic grid openings, wherein the neighboring metallic grid openings are laterally spaced by a line-shaped region of the metallic grid that has opposite sidewall respectively in the neighboring metallic grid openings, and wherein the opposite sidewalls of the metallic grid are directly over the one of the pixel sensors.

19. The image sensor according to claim 1, further comprising:
a second pixel sensor arranged within the semiconductor substrate;
a second metallic grid segment overlying the second pixel sensor and having a second metallic grid opening therein; and
a dielectric grid comprising the dielectric grid segment and a second dielectric grid segment, wherein the second dielectric grid segment overlies the second metallic grid segment and has a second dielectric grid opening therein, wherein the second dielectric grid opening neighbors the dielectric grid opening, wherein the dielectric grid opening and the second dielectric grid opening are laterally spaced by a line-shaped region of the dielectric grid, wherein the line-shaped region has opposite sidewalls respectively in the dielectric grid opening and the second dielectric grid opening, and wherein the opposite sidewalls are directly over the pixel sensor.

20. The image sensor according to claim 8, wherein the dielectric grid shift amount exceeds the metallic grid shift amount for the one of the pixel sensors.

* * * * *